United States Patent
Singh et al.

(10) Patent No.: US 10,498,312 B2
(45) Date of Patent: Dec. 3, 2019

(54) GLITCH IMMUNE CASCADED INTEGRATOR COMB ARCHITECTURE FOR HIGHER ORDER SIGNAL INTERPOLATION

(71) Applicant: STMicroelectronics International N.V., Schiphol (NL)

(72) Inventors: Mohit Singh, Delhi (IN); Ankur Bal, Greater Noida (IN)

(73) Assignee: STMicroelectronics International N.V., Schiphol (NL)

( * ) Notice: Subject to any disclaimer, the term of this patent is extended or adjusted under 35 U.S.C. 154(b) by 22 days.

(21) Appl. No.: 15/815,989

(22) Filed: Nov. 17, 2017

(65) Prior Publication Data

US 2019/0158070 A1    May 23, 2019

(51) Int. Cl.
*G06F 17/10* (2006.01)
*H03H 17/06* (2006.01)

(52) U.S. Cl.
CPC .... *H03H 17/0657* (2013.01); *H03H 17/0671* (2013.01)

(58) Field of Classification Search
None
See application file for complete search history.

(56) References Cited

U.S. PATENT DOCUMENTS

| | | | | |
|---|---|---|---|---|
| 5,880,973 A * | 3/1999 | Gray | ................... | H03H 17/0461 375/350 |
| 6,034,628 A * | 3/2000 | Draxelmayr | ....... | H03H 17/0251 341/61 |
| 6,161,118 A * | 12/2000 | Lu | ....................... | H03H 17/0671 708/208 |
| 7,170,959 B1 * | 1/2007 | Abbey | ............... | H03H 17/0251 375/225 |
| 7,324,025 B1 * | 1/2008 | Ding | ................... | H03H 17/0671 341/118 |
| 7,788,309 B2 * | 8/2010 | Wu | ...................... | H03H 17/0671 708/313 |
| 8,738,679 B2 | 5/2014 | Parida et al. | | |

(Continued)

OTHER PUBLICATIONS

Hogenauer, E. B.: "An Economical Class of Digital Filters for Decimation and Interpolation," IEEE Transactions on Acoustics, Speech and Signal Processing, ASSP-29(2):155-162, 1981.

(Continued)

*Primary Examiner* — David H Malzahn
(74) *Attorney, Agent, or Firm* — Crowe & Dunlevy

(57) ABSTRACT

A digital filtering method includes receiving a digital signal, and passing the digital signal through a Pth order comb cascade. The method includes beginning pre-computing of intermediate integrator states of a Pth order integrator cascade as a function of the digital signal, prior to receiving output from a last comb of the Pth order comb cascade. The outputs from each comb of the Pth order comb cascade are then applied to the pre-computed intermediate integrator states to thereby produce a filtered version of the digital signal. The Pth order comb cascade may operate at a sampling frequency, and the pre-computing of the intermediate integrator states is performed at the sampling frequency, while the application of the outputs from each comb of the Pth order comb cascade to the pre-computed intermediate integrator states is performed at a multiple of the sampling frequency.

20 Claims, 7 Drawing Sheets

(56) References Cited

U.S. PATENT DOCUMENTS

| | | | |
|---|---|---|---|
| 8,775,492 B2* | 7/2014 | Menkhoff | H03H 17/0219 |
| | | | 708/313 |
| 2003/0069911 A1* | 4/2003 | Piirainen | H03H 17/0288 |
| | | | 708/313 |
| 2015/0236670 A1* | 8/2015 | Pande | H03H 17/0671 |
| | | | 708/307 |
| 2019/0158070 A1* | 5/2019 | Singh | H03H 17/0657 |

OTHER PUBLICATIONS

Losada, R.A. et al: "Reducing CIC Filter Complexity," Signal Processing Magazine, IEEE, vol. 23, Issue 4, Jul. 2006 pp. 124-126.

* cited by examiner

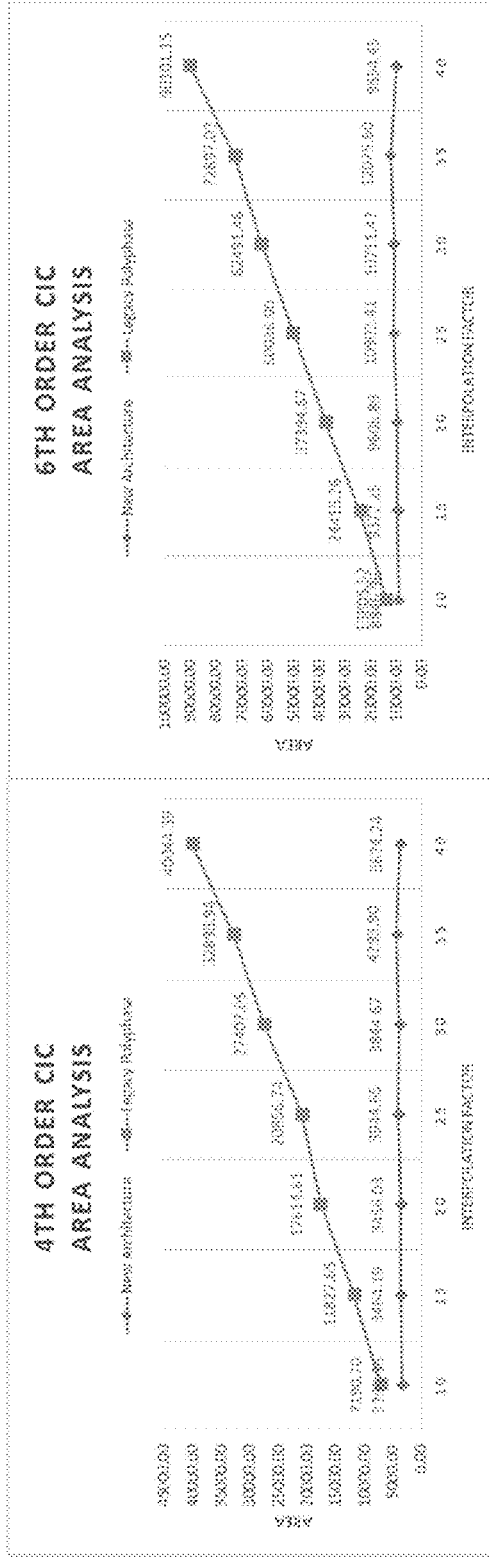
FIG. 6A
FIG. 6C
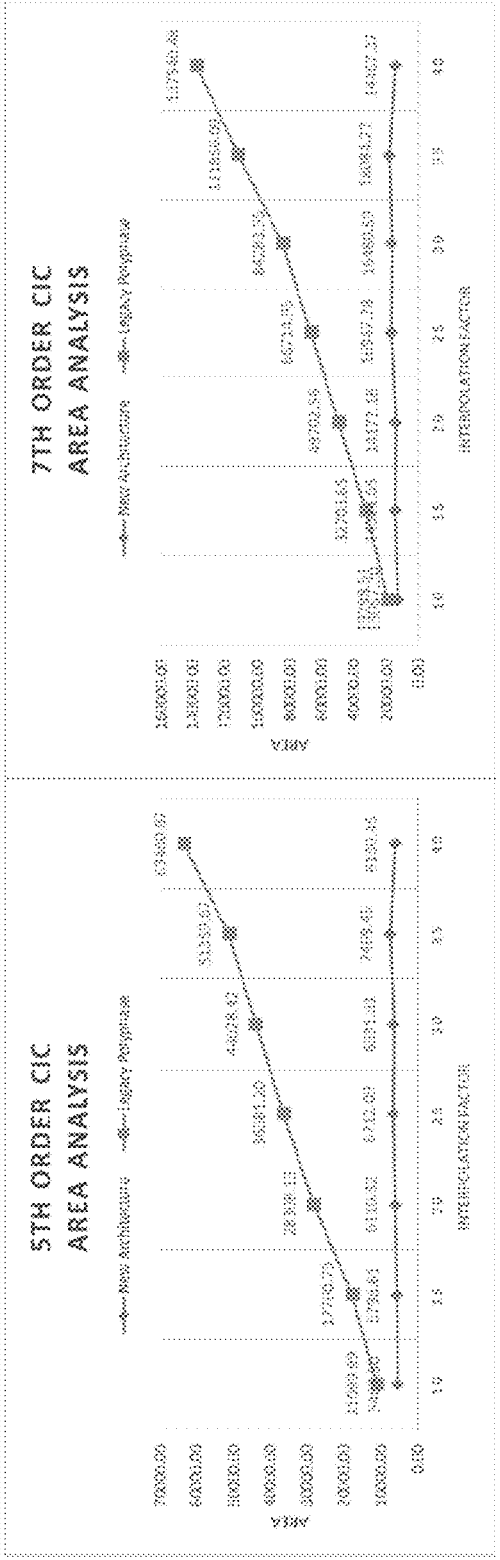
FIG. 6B
FIG. 6D

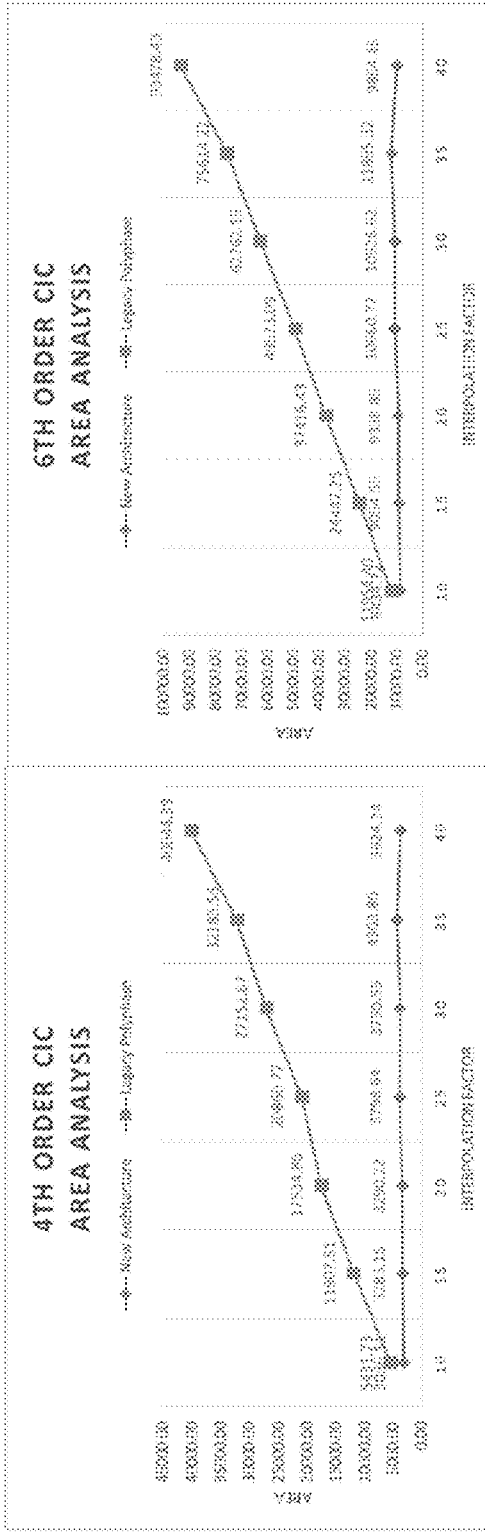
FIG. 8A — 4TH ORDER CIC AREA ANALYSIS
FIG. 8B — 5TH ORDER CIC AREA ANALYSIS
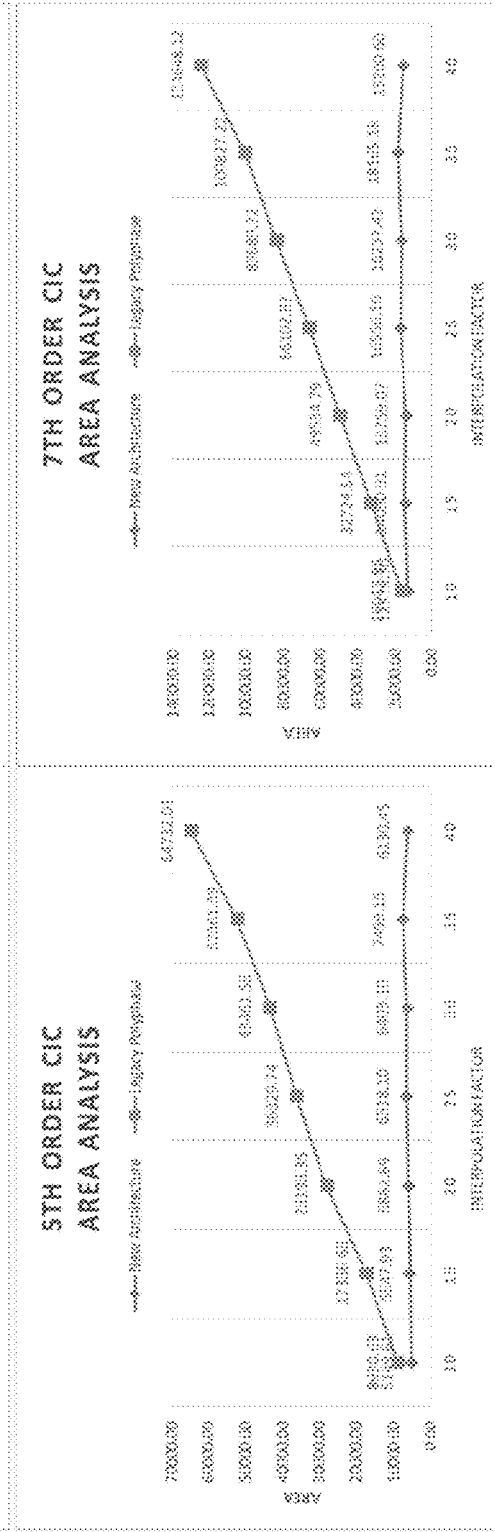
FIG. 8C — 6TH ORDER CIC AREA ANALYSIS
FIG. 8D — 7TH ORDER CIC AREA ANALYSIS

GLITCH IMMUNE CASCADED INTEGRATOR COMB ARCHITECTURE FOR HIGHER ORDER SIGNAL INTERPOLATION

TECHNICAL FIELD

The disclosure herein relates to interpolators for use in multi-rate processing and data interpolation applications, and, more particularly, to a cascaded integrator comb architecture that utilizes pre-computation of portions of integrator stages so as to provide for quicker processing and scalability to different orders and different interpolation factors.

BACKGROUND

Generally, an analog signal is used for transferring information and data across a communication channel. The analog signal can be converted into a digital signal at a receiving device such as a mobile phone, laptop, or television. Conversion from an analog signal to a digital signal is accomplished by sampling the analog signal at predetermined time intervals. Once a digital or discrete time signal has been generated, the sampling rate can be increased via interpolation. During interpolation, a set of new data points are constructed within a set of known data points by adding a number of samples between two or more known samples of a discrete-time signal. Generally, interpolation is performed when the digital signal is to be oversampled, for example while reconstructing an analog signal from the digital signal using a digital to analog converter (DAC).

Cascaded integrator comb (CIC) interpolators may be used for oversampling. CIC interpolators have an ability to handle arbitrary or large sampling rate changes and do not require complex hardware for implementation, thereby facilitating generation of a reliable undistorted analog signal in a DAC.

A sample CIC circuit 40 is shown in FIG. 1. The CIC circuit 40 includes a comb or differentiator 50 coupled to an integrator 60 through an upsampler 59. The differentiator 50 includes a delay block 52 and subtractor 54, both of which receive an input sequence X(k). The subtractor 54 subtracts the output of the delay block 52 from the input sequence as received, and passes the result to upsampler 59. The upsampler 59 inserts R−1 zero valued samples between each sample of the output of the differentiator 50, providing output U(n) to the integrator 60. The integrator 60 includes Adder 62 which adds the output of delay block 64 to U(n), and the delay block 64 itself receives the output of the adder 62 as input. The output produced by the adder 62 is the output signal Y(n).

During operation of the CIC 40, an offset can creep into the output generated by the integrators 60 due to word retention in the integrators 60. The error due to word retention may be accumulated over a period of time resulting in large errors. Additionally, the output can suffer from quantization errors on account of discrete values being assigned to displaced samples in the digital signal.

To reduce word retention and quantization errors, the integrator 60 may be reset once an offset is detected. Resetting the integrator 60 during operation of the CIC 40 can lead to loss of data, however. Further, prior art methods for offset detection and reset apply to first and second order interpolators, which are linear interpolators. Third and higher order interpolators provide for non-linear interpolation of input samples of the analog signal, and an attempt to reset such higher order integrators tends to distort the generated output, rendering this technique for reduction of word retention and quantization errors unhelpful.

Therefore, further development in the area of higher order CIC filters is needed.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

Described herein is a digital filtering method. The method includes receiving a digital signal, and passing the digital signal through an Pth order comb cascade. The method further includes beginning pre-computing of intermediate integrator states of an Pth order integrator cascade as a function of the digital signal, prior to receiving output from a last comb of the Pth order comb cascade. The outputs from each comb of the Pth order comb cascade are then applied to the pre-computed intermediate integrator states to thereby produce a filtered version of the digital signal.

Each integrator of the Pth order integrator cascade may perform both an integration function and an upscaling.

The upscaling may operate to interpolate at an interpolation factor of M.

The Pth order comb cascade may operate at a sampling frequency, and the pre-computing of the intermediate integrator states is performed at the sampling frequency, while the application of the outputs from each comb of the Pth order comb cascade to the pre-computed intermediate integrator states is performed at a multiple of the sampling frequency.

A circuit implementation is disclosed herein as well. The circuit implementation forms a cascaded integrator comb (CIC) filter including an input configured to receive a digital signal, and an Pth order comb cascade configured to receive the digital signal from the input. The Pth order comb cascade includes a first comb which is formed from a first delay element configured to receive the digital signal from the input, a first subtractor configured to subtract output from the first delay element from the digital signal from the input, and a delay element configured to receive input from the first delay element. The Pth order comb cascade includes a second comb which is formed from a second delay element configured to receive output from the first subtractor, and a second subtractor configured to subtract output from the second delay element from the output of the first subtractor. The Pth order comb cascade also includes a third comb which is formed from a third delay element configured to receive output from the second subtractor, a third subtractor configured to subtract output from the third delay element from the output of the second subtractor, and a fourth delay element configured to receive output from the third subtractor.

The CIC filter also includes an Pth order integrator cascade that includes a first integrator circuit having a first pre-computation portion receiving input from the second subtractor and providing output to a first computation portion, a second integrator circuit having a second pre-computation portion receiving input from the second subtractor and the second delay element and providing output to a second computation portion, and a third integrator circuit having a third pre-computation portion receiving input from the second subtractor and the second delay element and providing output to a third computation portion. The first computation portion also receives input from the fourth delay element. The second computation portion also receives input from the first computation portion. The third computation portion also receives input from the second computation portion. A filtered version of the digital signal is produced at output of the third computation portion.

BRIEF DESCRIPTION OF THE DRAWINGS

FIGS. 6A-6D illustrate area vs interpolation factor for $4^{th}$ order through $7^{th}$ order CIC interpolators implemented according to this disclosure, at an input data rate of 2 GHz.

FIGS. 8A-8D illustrate area vs interpolation factor for $4^{th}$ order through $7^{th}$ order CIC interpolators implemented according to this disclosure, at an input data rate of 500 MHz.

DETAILED DESCRIPTION

One or more embodiments of the present disclosure will be described below. These described embodiments are only examples of the presently disclosed techniques. Additionally, in an effort to provide a concise description, certain nonessential features of an actual implementation may not be described in the specification.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

Cascaded Integrator Comb (CIC) architectures are typically used for interpolation, such as during audio and/or video data processing. Interpolation includes adding a number of samples between two samples of the discrete-time signal. A classical CIC filter of $P^{th}$ order is represented using P stages of differentiators and integrators.

As stated above, a classical CIC interpolating filter includes a cascade of differentiators, followed by a rate changer and a cascade of integrators. The transfer function of the classical CIC interpolating filter is given by:

$$H(z) = \{(1-z^{-M})/(1-z^{-1})\}^P$$

Figure 1:
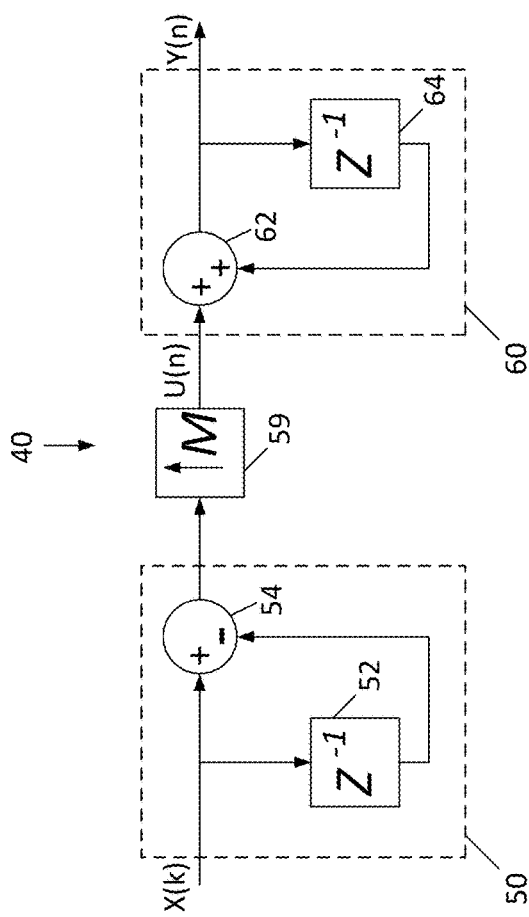
FIG. 1 is a block diagram of a classical first order M degree CIC interpolator.

The variable M is an integer rate change factor that mainly depends on the desired magnitude of (sampling) rate change and on the stop band attenuation specification of the filter under consideration. The variable M may be equal to the interpolation ratio of the CIC filter, also called the degree of the CIC filter. For discussion purposes, M will be referred to as the degree of the filter. The variable P is the order of the filter. If the value of P is one, the CIC interpolating filter is a first order filter and includes one stage of a differentiator 50 and one stage of an integrator 60, as shown in FIG. 1. If the value of P is two, the CIC interpolating filter is a second order filter and includes two stages of differentiators and two stages of integrators, and so on. Typically, the higher the order of the interpolating filter, the better the quality of the filtered output signal that is produced.

However, in case any offsets creep into the integrators due to word retention, such as while using a jittery clock, the offsets are accumulated over time thereby producing erroneous output values. In the generally used implementations of cascaded integrators, the integrators can not be reset to a base value periodically because the integrators are built using filters, such as IIR type filters, that are to retain history of previous outputs. Any periodic reset will reset the memory elements of the filters and produce incorrect outputs.

The described subject matter relates to systems and methods for designing offset-free CIC interpolating filters. It will be understood that interpolating filters have been interchangeably referred to as interpolators hereinafter.

An implementation of the offset-free CIC interpolator, corresponding to the analyzed CIC filter, can be devised from the analytical equations using differentiators, integrators and constant coefficient multipliers. Typically, the differentiators operate at a first sampling frequency of $F_s$. The integrators operate at a second sampling frequency, which is a function of the first sampling frequency, such as $M*F_s$. The offset-free CIC interpolator can include other elements such as adders and delay elements.

Such offset-free CIC interpolators are not limited to linear interpolation and can be devised for offset-free implementation of CIC filters of any order and degree. Further, these offset-free interpolators can be used in any audio/video processing systems, sigma delta modulators, digital to analog converters, etc.

Figure 2:
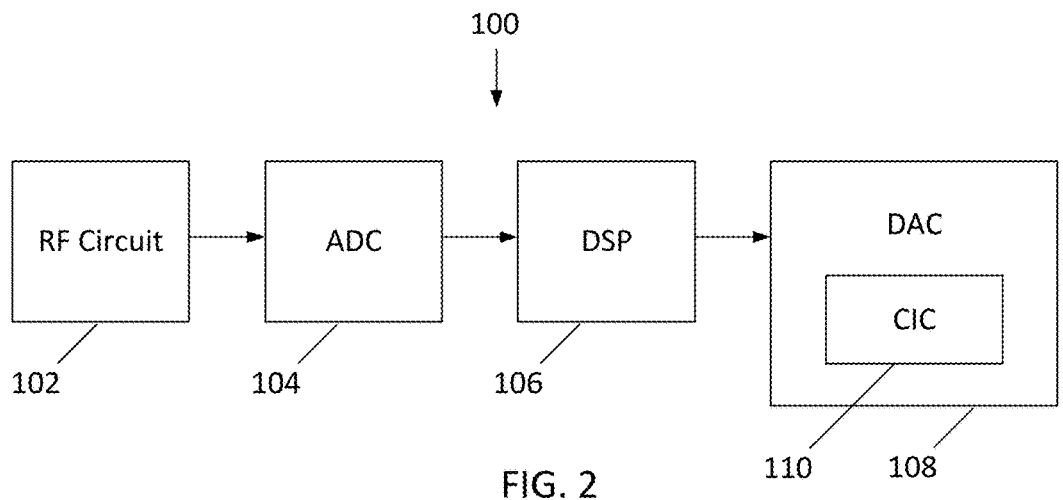
FIG. 2 is a block diagram of system including an offset-free CIC interpolator in accordance with this disclosure.

FIG. 2 illustrates an exemplary system 100 implementing an offset-free CIC interpolator. The order in which the blocks of the system are described is not intended to be construed as a limitation, and any number of the described system blocks can be combined in any order to implement the system, or an alternate system. Additionally, individual blocks may be deleted from the system without departing from the spirit and scope of the subject matter described herein. Furthermore, the system can be implemented in any suitable discrete analog and digital components, a programmed microprocessor, or a combination thereof, without departing from the scope of the disclosure.

The system 100 receives an analog input signal generated by any electronic or communication device such as a mobile phone, a computing system, a personal digital assistant, a broadcasting server, etc. The input signal may include, for example, an audio signal, a video signal, a data signal, etc., and can be received by a radio frequency (RF) circuit 102. The RF circuit 102 processes the input signal to provide a low frequency baseband signal to an analog-to-digital converter (ADC) 104 for digitization.

The ADC 104 samples the baseband signal at a sampling rate greater than the Nyquist rate to provide a discrete or digital signal. The sampling rate corresponds to the number of samples per second taken from the baseband signal. The digital signal is then processed in a digital signal processor (DSP) 106. The DSP 106 can process the digital signal using a variety of processing techniques known in the art such as filtration, amplification, modulation, etc. to provide a processed digital signal.

The processed digital signal is received by a digital to analog converter (DAC) 108 to generate an analog output signal. Due to processing of the input signal by the RF circuit 102, the ADC 104, the DSP 106 and the DAC 108, the output signal is of a quality better than that of the input signal. In an implementation, the system 100 can correspond delay block 52b and a subtractor 54b, both of which receive output from differentiator 50a. The subtractor 54b subtracts the output of delay block 54b from the input as received, and passes the result to differentiator 50c. Differentiator 50c includes a delay block 52c and a subtractor 54c, both of which receive output from differentiator 50b. The subtractor 54c subtracts the output of delay block 54c from the input as received, and passes the result as output Y(n).

Figure 1A:
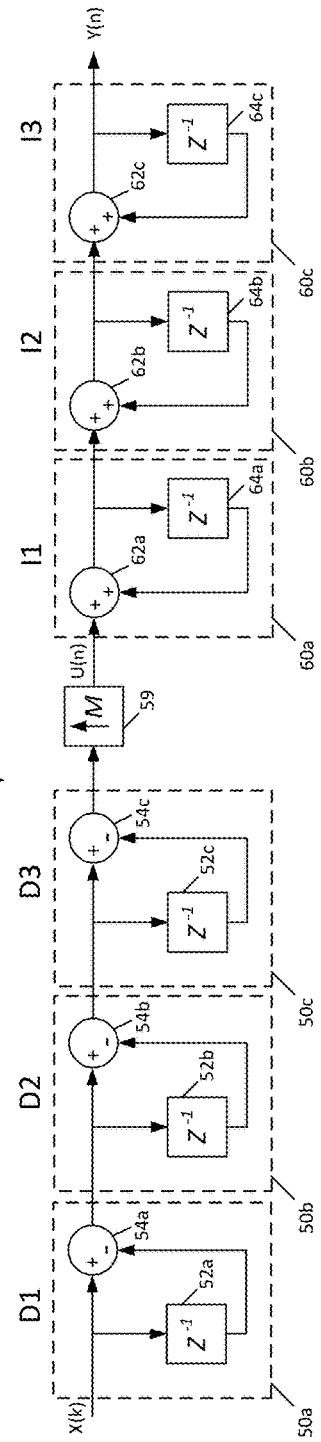
FIG. 1A is a block diagram of a classical third order M degree CIC interpolator.

For an input sequence X(k) equal to [A, B, C, D], the outputs of each differentiator 50a, 50b, 50c and each integrator 60a, 60b, 60c are shown in the chart below. It is noted that, in FIG. 1A, differentiators 50a, 50b, 50c can be respectively referred to as $D_1$, $D_2$, $D_3$, and that integrators 60a, 60b, 60c can be respectively referred to as $I_1$, $I_2$, $I_3$.

| X(k) | Output 50a | Output 50b | Output 50c | Output 60a | Output 60b | Output 60c |
|---|---|---|---|---|---|---|
| A | A | A | A | A | A | A |
| B | B − A | B − 2A | B − 3A | A | 2A | 3A |
| C | C − B | C − 2B + A | C − 3B + 3A | A | 3A | 6A |
| D | D − C | D − 2C + B | D − 3C + 3B − A | B − 2A | B + A | B + 7A |
|   |   |   |   | B − 2A | 2B − A | 3B + 6A |
|   |   |   |   | B − 2A | 3(B − A) | 6(B − A) + 9A |
|   |   |   |   | C − 2B + A | C + B − 2A | C + 7B + A |
|   |   |   |   | C − 2B + A | 2C − B − A | 3C + 6B |
|   |   |   |   | C − 2B + A | 3(C − B) | 6(C − B) + 9B |
|   |   |   |   | D − 2C + B | D + C − 2B | D + 7C + B |
|   |   |   |   | D − 2C + B | 2D − C − B | 3D + 6C |
|   |   |   |   | D − 2C + B | 3(D − C) | 6(D − C) + 9C | to an audio processing system where the input signal is an audio signal, and the DAC 108 generates an output audio signal for a speaker. In another implementation, the system 100 can correspond to a video or image processing system where the input signal is an image signal and the DAC 108 generates an output image signal for a monitor or screen.

The DAC 108 uses an offset-free CIC interpolator 110 for reconstruction of an analog signal from a digital signal by interpolation. Interpolation refers to the technique of up-sampling of a received digital signal by adding additional samples. The offset-free CIC interpolator 110 can handle arbitrary and large sampling rate changes and has high processing speed.

In an implementation, the offset-free CIC interpolator 110 includes multiple differentiators and integrators, and will be described in detail in a later section. The offset-free CIC interpolator 110 can be devised based on empirically determined equations, as will be explained.

Though the offset-free CIC interpolator 110 has been shown as a part of the DAC 108 in system 100, it will be understood that the offset-free CIC interpolator 110 can be implemented in other modules, such as a digital signal processing module, a sigma delta modulator, or can be a stand alone module.

Derivation of the proposed architecture will now be described. Shown in FIG. 1B is a classical third order CIC circuit 40'. The CIC circuit 40' includes three cascaded differentiators 50a, 50b, 50c coupled an upsampler 59. The upsampler 59 is in turn coupled to three cascaded integrators 60a, 60b, 60c. The upsampler 59 inserts M−1 zero valued samples between each sample of the output of the differentiator 50c, providing output to the integrator 60a.

The differentiator 50a includes a delay block 52a and subtractor 54a, both of which receive an input sequence X(k). The subtractor 54a subtracts the output of the delay block 52a from the input sequence as received, and passes the result to differentiator 50b. Differentiator 50b includes a From this chart, it can be deduced that for an interpolate by M filter:

$$I_2(k)=M*D_2(n-1)+K*D_1(n)$$

$$I_3(k)=\Sigma M*D_2(n-1)+M^2*D_3(n-2)+K*M*D_2(n-1)+\Sigma K*D_1(n)$$

Thus, the states of the integrators 50a, 50b, 50c are known and can be precomputed, permitting the application of the data samples to the precomputed states to thereby provide for quicker processing.

The Inventors have thus precomputed the states for the following Pth order CIC filters:

$$I_2(k)=M*D_2(n-1)$$

$$I_3(k)=\Sigma M*D_2(n-1)+M^2*D_3(n-2)=I_4(k)=\Sigma\Sigma M*D_2(n-1)+2M\Sigma MD_3(n-2)+M^3*D_4(n-3)$$

$$I_5(k)=\Sigma\Sigma\Sigma M*D_2(n-1)+(2M\Sigma\Sigma M+\Sigma M\Sigma M)*D_3(n-2)+3M^2\Sigma M*D_4(n-3)+M^4*D_5(n-4)$$

$$I_6(k)=\Sigma\Sigma\Sigma\Sigma M*D_2(n-1)+(2M\Sigma\Sigma\Sigma M+2\Sigma M\Sigma\Sigma M)*D_3(n-2)+(3M^2\Sigma\Sigma M+3M\Sigma M\Sigma M)*D_4(n-3)+3M^3\Sigma M*D_5(n-4)+M^5D_6(n-5)$$

Figure 3:
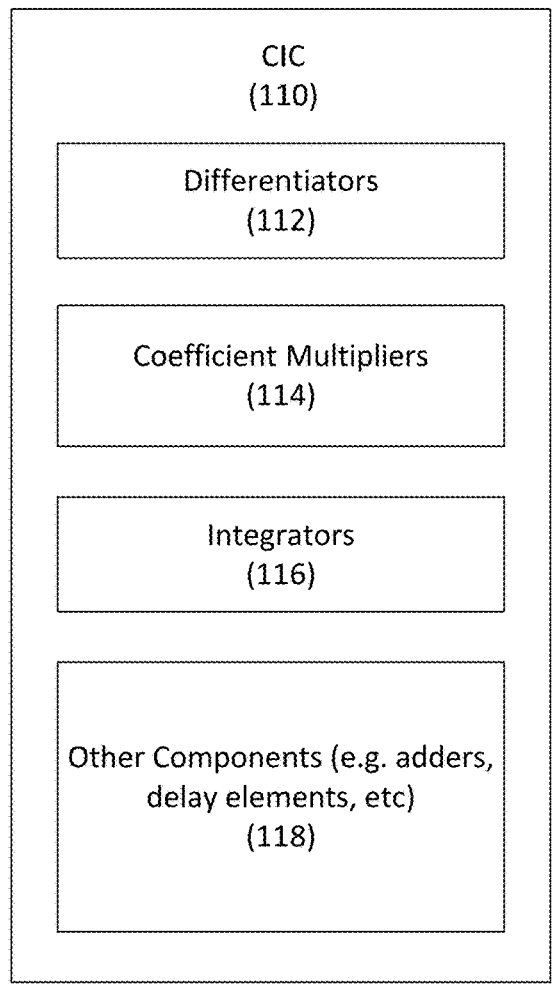
FIG. 3 is a block diagram of the CIC interpolator of FIG. 2.

A hardware implementation example is now described with reference to FIGS. 3-4. FIG. 3 illustrates a block diagram of an exemplary offset-free CIC interpolator 110. The offset-free CIC interpolator 110 can be of any desired order P and degree M. In an implementation, the offset-free CIC interpolator 110 receives an input digital signal having a sampling frequency $F_s$ and generates an interpolated output digital signal having a sampling frequency $M*F_s$. For this, the offset-free CIC interpolator 110 includes differentiators 112, coefficient multipliers 114 and integrators 116.

The differentiators 112 operate at the sampling frequency of the input digital signal $F_s$ and use a delay element to provide an output based on a current input value and a previous input value. The integrators 116 operate at the sampling frequency of the output digital signal $PF_s$ and use a delay element to provide an output based on a current input value and a previous output value. The coefficient multipliers 114 multiply a received value with a constant coefficient value. The constant coefficient value is a function of the variable M, the rate change or interpolation factor. The differentiators 112, coefficient multipliers 114, and the integrators 116 are operatively coupled to each other. The differentiators 112, coefficient multipliers 114 and the integrators 116 may be operatively coupled by connecting them directly to each other or through other components 118, such as adders, subtractors, summation blocks, delay elements, etc., or any combination thereof.

Figure 4:
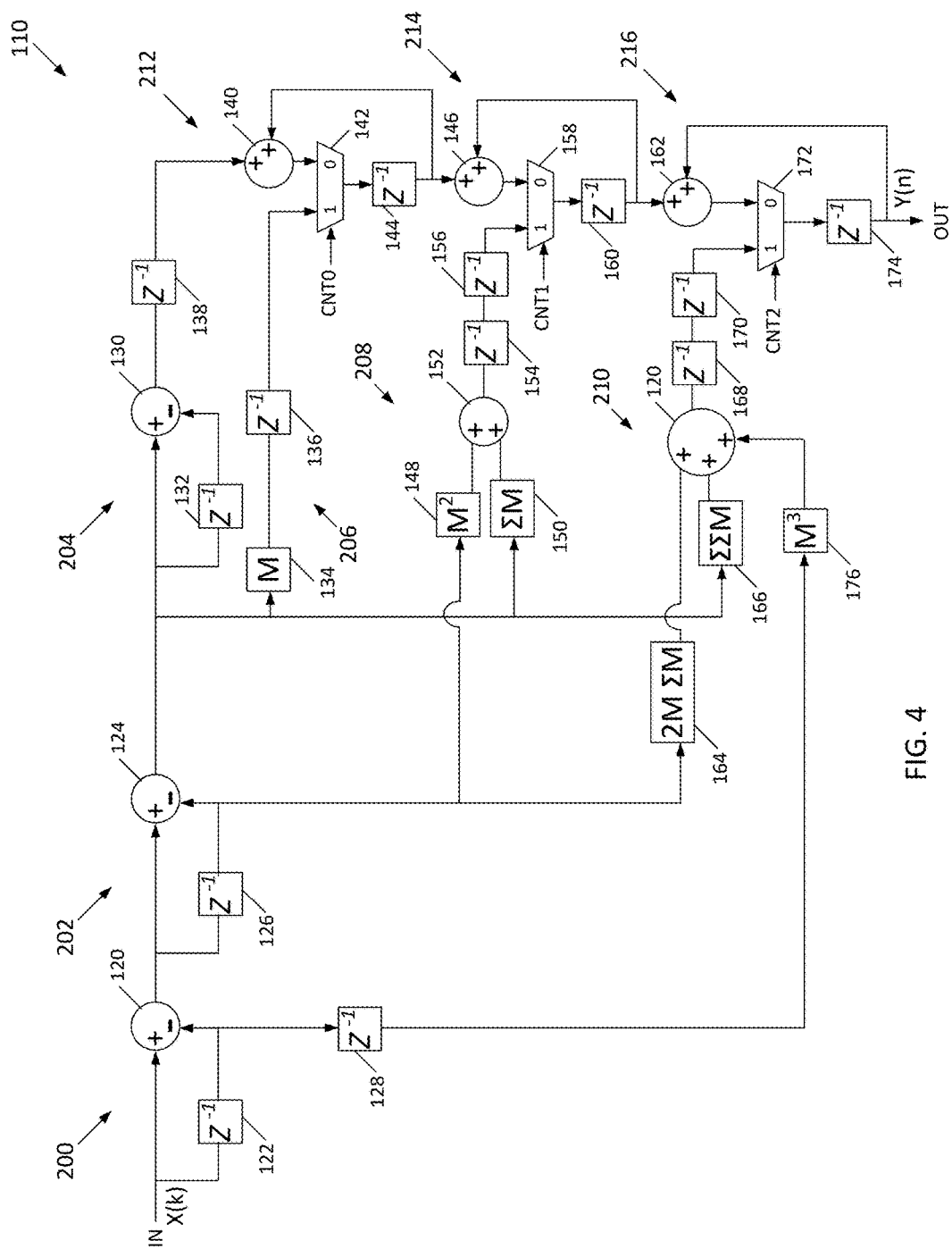
FIG. 4 is a detailed schematic block diagram of the CIC interpolator of FIGS. 2-3.
Figures 5A, 5B, 5C, 5D:
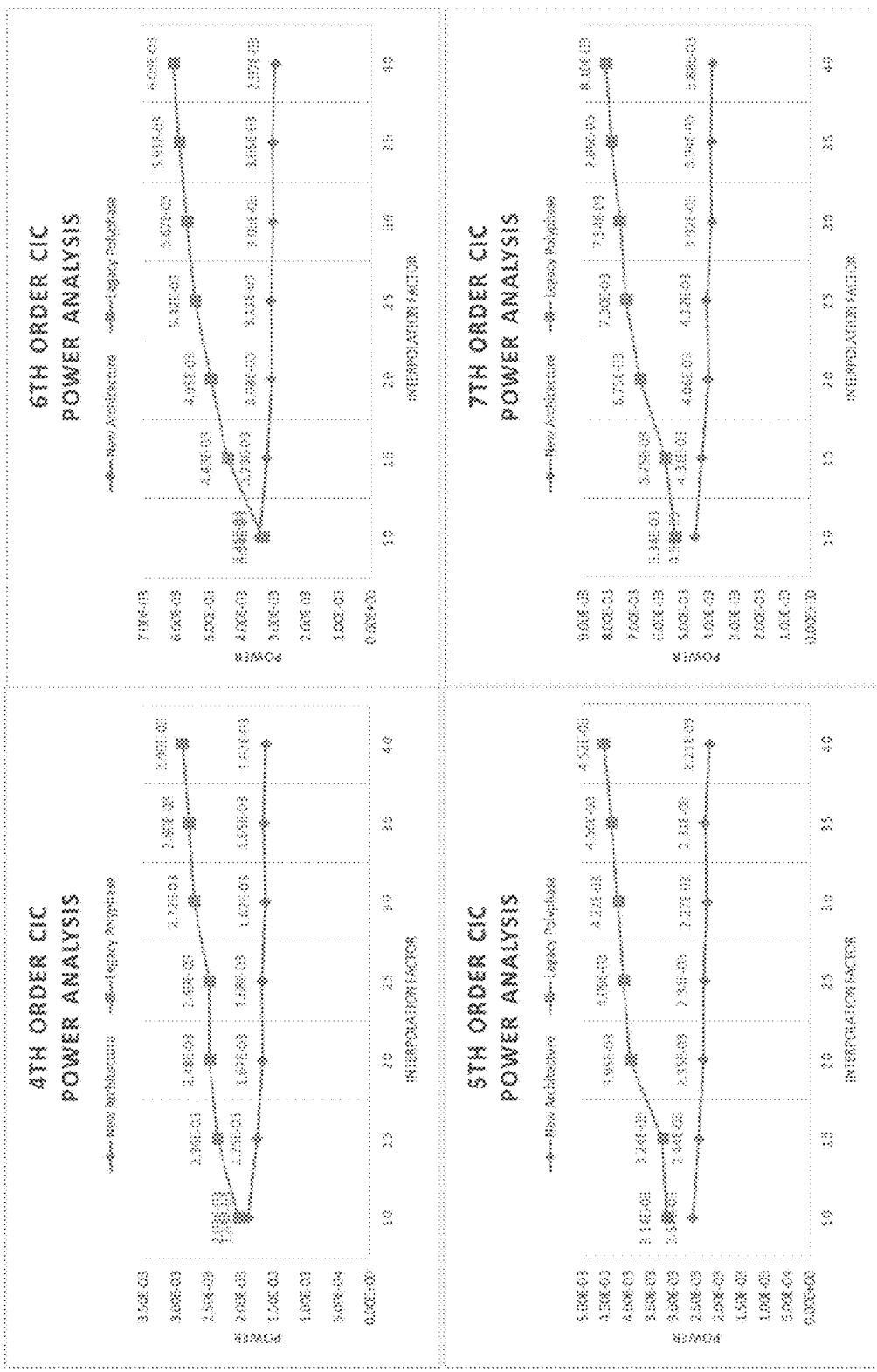
FIGS. 5A-5D illustrate power consumption vs interpolation factor for $4^{th}$ order through $7^{th}$ order CIC interpolators implemented according to this disclosure, at an input data rate of 2 GHz.
Figures 7A, 7B, 7C, 7D:
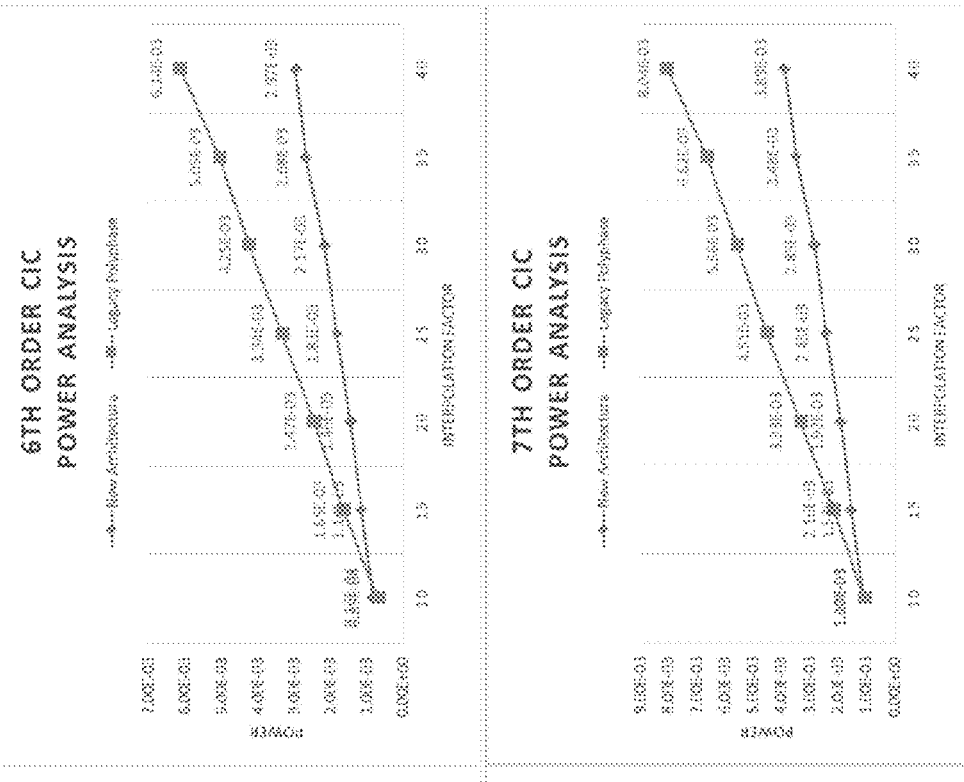
FIGS. 7A-7D illustrate power consumption vs interpolation factor for $4^{th}$ order through $7^{th}$ order CIC interpolators implemented according to this disclosure, at an input data rate of 500 MHz.

In particular, as shown in FIG. 4, the offset-free CIC interpolator 110 includes first, second, and third combs or differentiators 200, 202, 204. The first differentiator 200 includes a first delay element 122 receiving the digital signal X(k) from the input IN, and a first subtractor 120 that subtracts output from the first delay element 122 from the digital signal X(k). The second differentiator 202 includes a second delay element 126 receiving output from the first subtractor 129, and a second subtractor that subtracts output from the second delay element 126 from the output of the first subtractor 120. The third differentiator 204 includes a third delay element 132 receiving output from the second subtractor 124, and a third subtractor that subtracts output from the third delay element 132 from the output of the second subtractor 124.

The offset-free CIC interpolator 110 also includes first, second, and third integrator circuits. The first integrator circuit is comprised of a pre-computation portion 206 and a computation portion 212. The pre-computation portion 206 comprises a coefficient multiplier 134 receiving input from the second subtractor 124 and providing output to delay block 136. The pre-computation portion 206 also includes a delay block 138 receiving input from the third subtractor 130.

The computing portion 212 includes an adder 140 that receives input from the delay block 138 and a first intermediate signal (received from delay block 144, described below), and provides output to multiplexer 142. Multiplexer 142 also receives input from the delay element 136, and provides output to the delay element 144. The output of the delay element 144, as stated, is coupled to the adder 140.

The second integrator circuit is comprised of a pre-computation portion 208 and a computation 214. The pre-computation portion 208 includes a coefficient multiplier that multiplies by a square of the coefficient (thus, it is a coefficient squarer) 140 receiving input from the delay element 126, and providing output to adder 152. Adder 152 also receives input from summation block 150, which itself received output from the subtractor 124. Adder 152 in turn provides output to delay block 154, which itself in turn provides output to delay block 156.

The computation portion 214 includes the multiplexer 158, which receives input from the delay element 156, as well as from summation block 146. Summation block 146 receives input from the delay block 144, as well as a second intermediate signal (received from delay block 160, described below), and provides output to the multiplexer 158, which in turn provides output to the delay block 160. Output from the delay block 160, as stated, is coupled to the adder 146.

The third integrator circuit is comprised of a pre-computation portion 210 and a computation portion 216. The pre-computation portion 210 includes a coefficient multiplier and summation block 164 receiving input from the delay element 126. The pre-computation portion 210 also includes a double summation block 164 and a coefficient mutiplier 176 that multiplies by the cube of the coefficient. An adder 120 receives input from the coefficient multiplier and summation block 164 the doubler summation block 164, and the coefficient multiplier 176, and provides output to delay element 168. Delay element 168 in turn provides output to delay element 170.

The computation portion 216 includes adder 162 which receives input from the delay element 160, as well as from the output Y(n) of the CIC interpolator 110. A multiplexer 172 receives input from the delay element 170 and the adder 162, and provide output to the delay element 174, which provides the output Y(n) of the CIC interpolator 110.

The multiplexers 142, 158, 172 are respectively switched by count signals CNT0, CNT1, CNT2, which are cyclically asserted, with CNT0 being asserted first while CNT1 and CNT2 are deasserted, then CNT1 being asserted second while CNT0 and CNT2 are deasserted, and then CNT2 being asserted third while CNT0 and CNT1 are deasserted.

In operation, at the end of each interpolation cycle M, the output of an integrator is loaded to a pre-computed intermediate result state using the multiplexer 144,160,174 shown in FIG. 4, making it immune to offset and glitches. In order to carry out the pre-computation at a slower, thus timing efficient rate, additional delay flops 136,154,156, 168,170 shown in FIG. 4 have been added. The iterative actuation compensates for this delay mismatch at comb inputs.

This CIC 110 described above provides for a glitch-immune CIC design with feedback integrator IIR filter structures. It utilizes non-overflowing integrator states which allow variable sized integrator stages. In addition, the low speed feedback pre-computation capability allows the use of high speed integrators. Furthermore, this design is scalable for different orders of CIC interpolators of different degrees.

In addition, the CIC 110 provides for greatly reduced power consumption compared to classical CIC interpolators at higher interpolation factors. For example, FIGS. 5A-5D illustrate power consumption vs interpolation factor for $4^{th}$ order through $7^{th}$ order CIC interpolators implemented according to the designs described herein, at an input data rate of 2 GHz. As another example, FIGS. 7A-7D illustrate power consumption vs interpolation factor for $4^{th}$ order through $7^{th}$ order CIC interpolators implemented according to the designs described herein, at an input data rate of 500 MHz. As can be seen in FIGS. 5A-5D and 7A-7D, the CIC 110 provides for relatively steady power consumption regardless of interpolation factor, unlike classical CIC interpolators. Similarly, as can be seen in FIGS. 6A-6D and 8A-8D, the CIC 110 provides for a relatively steady area regardless of interpolation factor, allowing for the implementation of high interpolation factor CIC interpolation factors in compact spaces.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:
1. A digital filtering method, comprising:
receiving a digital signal;
passing the digital signal through a Pth order comb cascade, wherein P is at least three;

beginning pre-computing of integrator states of a Pth order integrator cascade as a function of the digital signal, prior to receiving output from a last comb of the Pth order comb cascade; and applying the outputs from each comb, except a Pth comb, of the Pth order comb cascade to the pre-computed integrator states to thereby produce a filtered version of the digital signal.

2. The digital filtering method of claim 1, wherein each integrator of the Pth order integrator cascade performs both an integration function and an upscaling.

3. The digital filtering method of claim 2, wherein the upscaling operates to interpolate at a interpolation factor of M.

4. The digital filtering method of claim 3, wherein the Pth order comb cascade operates at a sampling frequency; wherein the pre-computing of the integrator states is performed at the sampling frequency; and wherein the application of the outputs from each comb, except the Pth comb, of the Pth order comb cascade to the pre-computed integrator states is performed at a multiple of the sampling frequency.

5. The digital filtering method of claim 1, wherein the Pth order comb cascade comprises a $3^{rd}$ order comb cascade having first, second, and third stages; wherein the Pth order integrator cascade comprises a $3^{rd}$ order integrator cascade having first, second, and third stages; wherein the pre-computed integrator state of the second stage of the $3^{rd}$ order integrator cascade is precomputed as $M*D_2(n-1)$; wherein the pre-computed integrator state of the third stage of the $3^{rd}$ order integrator cascade is precomputed as a sum of first and second expressions, wherein the first expression is a summation performed on M multiplied by $D_2(n-1)$, and wherein the second expression is $M^2*D_3(n-2)$; wherein M is the interpolation factor, $D_2(n-1)$ is output from the second stage of the $3^{rd}$ order comb cascade, and $D_3(n-2)$ is output from the third stage of the $3^{rd}$ order comb cascade.

6. The digital filtering method of claim 1, wherein the Pth order comb cascade comprises a 4th order comb cascade having first, second, third, and fourth stages; wherein the Pth order integrator cascade comprises a 4th order integrator cascade having first, second, third, and fourth stages; wherein the pre-computed integrator state of the second stage of the 4th order integrator cascade is precomputed as $M*D_2(n-1)$; wherein the pre-computed integrator state of the third stage of the 4th order integrator cascade is precomputed as a sum of first and second expressions, wherein the first expression is a summation performed on M multiplied by $D_2(n-1)$, and wherein the second expression is $M^2*D_3(n-2)$; wherein the pre-computed integrator state of the fourth stage of the 4th order integrator cascade is precomputed as a sum of first, second, and third expressions, wherein the first expression is a double summation performed on M multiplied by $D_2(n-1)$, wherein the second expression is a product of 2, M, a summation performed on M, and $D_3(n-1)$, wherein the third expression is $M^3*D_4(n-3)$; and wherein M is the interpolation factor, $D_2(n-1)$ is output from the second stage of the 4th order comb cascade, $D_3(n-2)$ is output from the third stage of the $4^{th}$ order comb cascade, and $D_4(n-3)$ is output from the fourth stage of the $4^{th}$ order comb cascade.

7. The digital filtering method of claim 1, wherein the Pth order comb cascade comprises a $5^{th}$ order comb cascade having first, second, third, fourth, and fifth stages; wherein the Pth order integrator cascade comprises a $5^{th}$ order integrator cascade having first, second, third, fourth, and fifth stages; wherein the pre-computed integrator state of the second stage of the $5^{th}$ order integrator cascade is precomputed as $M*D_2(n-1)$; wherein the pre-computed integrator state of the third stage of the 5th order integrator cascade is precomputed as a sum of first and second expressions, wherein the first expression is a summation performed on M multiplied by $D_2(n-1)$, and wherein the second expression is $M^2*D_3(n-2)$; wherein the pre-computed integrator state of the fourth stage of the 5th order integrator cascade is precomputed as a sum of first, second, and third expressions, wherein the first expression is a double summation performed on M multiplied by $D_2(n-1)$, wherein the second expression is a product of 2, M, a summation performed on M, and $D_3(n-2)$, wherein the third expression is $M^3*D_4(n-3)$; wherein the pre-computed integrator state of the fifth stage of the 5th order integrator cascade is precomputed as a sum of first, second, third, and fourth expressions, wherein the first expression is a triple summation performed on M multiplied by $D_2(n-1)$, wherein the second expression is a product of $D_3(n-2)$ and sum of a product of $2*M$ and a double summation performed on M and a product of a summation performed on M and a summation performed on M, wherein the third expression is a product of $3M^2$, a summation performed on M, and $D_4(n-3)$, wherein the fourth expression is $M^4*D_5(n-4)$; and wherein M is the interpolation factor, $D_2(n-1)$ is output from the second stage of the 5th order comb cascade, $D_3(n-2)$ is output from the third stage of the 5th order comb cascade, $D_4(n-3)$ is output from the fourth stage of the $5^{th}$ order comb cascade, and $D_5(n-4)$ is output from the fifth stage of the $5^{th}$ order comb cascade.

8. The digital filtering method of claim 1, wherein the Pth order comb cascade comprises a 6th order comb cascade having first, second, third, fourth, fifth, and sixth stages; wherein the Pth order integrator cascade comprises a 6th order integrator cascade having first, second, third, fourth, fifth, and sixth stages; wherein the pre-computed integrator state of the second stage of the 6th order integrator cascade is precomputed as $M*D_2(n-1)$; wherein the pre-computed integrator state of the third stage of the 6th order integrator cascade is precomputed as a sum of first and second expressions, wherein the first expression is a summation performed on M multiplied by $D_2(n-1)$, and wherein the second expression is $M^2*D_3(n-2)$; wherein the pre-computed integrator state of the fourth stage of the 6th order integrator cascade is precomputed as a sum of first, second, and third expressions, wherein the first expression is a double summation performed on M multiplied by $D_2(n-1)$, wherein the second expression is a product of 2, M, a summation performed on M, and $D_3(n-2)$, wherein the third expression is $M^3*D_4(n-3)$; wherein the pre-computed integrator state of the fifth stage of the 6th order integrator cascade is precomputed as a sum of first, second, third, and fourth expressions, wherein the first expression is a triple summation performed on M multiplied by $D_2(n-1)$, wherein the second expression is a product of $D_3(n-2)$ and sum of a product of $2*M$ and a double summation performed on M and a product of a summation performed on M and a summation performed on M, wherein the third expression is a product of $3M^2$, a summation performed on M, and $D_4(n-3)$, wherein the fourth expression is $M^4*D_5(n-4)$; wherein the pre-computed integrator state of the sixth stage of the 6th order integrator cascade is precomputed as a sum of first, second, third, fourth, and fifth expressions, wherein the first expression is a quadruple summation performed on M multiplied by $D_2(n-1)$, wherein the second expression is $D_3(n-2)$ multiplied by a sum of a product of $2*M$ and a triple summation performed on M and a product of two times a summation performed on M and a double summation performed on M, wherein the third expression is a produce of D4(n−3) and a sum of a product of $3M^2$ and a double summation performed on M, and a product of 3M, a summation performed on M, and a summation performed on M, wherein the fourth expression is $3M^3$ multiplied by a summation performed on M, multiplied by $D_5(n-4)$, wherein the fifth expression is $M^5*D_6(n-5)$; and wherein M is the interpolation factor, $D_2(n-1)$ is output from the second stage of the 6th order comb cascade, $D_3(n-2)$ is output from the third stage of the 6th order comb cascade, $D_4(n-3)$ is output from the fourth stage of the $6^{th}$ order comb cascade, $D_5(n-4)$ is output from the fifth stage of the $6^{th}$ order comb cascade, and $D_6(n-5)$ is output from the sixth stage of the $6^{th}$ order comb cascade.

9. A cascaded integrator comb (CIC) filter, comprising:
an input configured to receive a digital signal;
a Pth order comb cascade configured to receive the digital signal from the input and comprising:
  a first comb comprising:
    a first delay element configured to receive the digital signal from the input;
    a first subtractor configured to subtract output from the first delay element from the digital signal from the input; and
    a delay element configured to receive input from the first delay element;
  a second comb comprising:
    a second delay element configured to receive output from the first subtractor; and
    a second subtractor configured to subtract output from the second delay element from the output of the first subtractor;
  a third comb comprising:
    a third delay element configured to receive output from the second subtractor;
    a third subtractor configured to subtract output from the third delay element from the output of the second subtractor; and
    a fourth delay element configured to receive output from the third subtractor; and
a Pth order integrator cascade comprising:
  a first integrator circuit having a first pre-computation portion receiving input from the second subtractor and providing output to a first computation portion;
  a second integrator circuit having a second pre-computation portion receiving input from the second subtractor and the second delay element and providing output to a second computation portion;
  a third integrator circuit having a third pre-computation portion receiving input from the second subtractor and the second delay element and providing output to a third computation portion;
  wherein the first computation portion also receives input from the fourth delay element;
  wherein the second computation portion also receives input from the first computation portion;
  wherein the third computation portion also receives input from the second computation portion;
  wherein a filtered version of the digital signal is produced at output of the third computation portion.

10. The CIC filter of claim 9, wherein the first pre-computation portion comprises a coefficient multiplier receiving input from the second subtractor and a fifth delay element receiving output from the coefficient multiplier.

11. The CIC filter of claim 10, wherein the first computation portion comprises a first adder receiving input from the fourth delay element and a first intermediate signal, a first multiplexer receiving input from the fifth delay element and the first adder, and a sixth delay element receiving input from the first multiplexer; wherein output from the sixth delay element provides the first intermediate signal.

12. The CIC filter of claim 11, wherein the second pre-computation portion comprises a squared coefficient multiplier receiving input from the second delay element, a first integrator receiving input from the second subtractor, a second adder receiving input from the squared coefficient multiplier and the first integrator, a seventh delay element receiving input from the second adder, and an eighth delay element receiving input from the seventh delay element.

13. The CIC filter of claim 12, wherein the second computation portion comprises a third adder receiving input from the sixth delay element and a second intermediate signal, a second multiplexer receiving input from the eighth delay element and the third adder, and a ninth delay element receiving input from the second multiplexer; wherein output from the ninth delay element provides the second intermediate signal.

14. The CIC filter of claim 13, wherein the third pre-computation portion comprises a first block receiving input from the second delay element and comprising a double coefficient multiplier multiplied by a coefficient integrator, a second block receiving input from the second subtractor and comprising a double coefficient integrator, a third block comprising a coefficient cuber receiving input from the delay element, a fourth adder receiving input from the first block, second block, and third block, a tenth delay element receiving output from the fourth adder, and an eleventh delay element receiving output from the tenth delay element.

15. The CIC filter of claim 14, wherein the third computation portion comprises a fifth adder receiving input from the ninth delay element and a third intermediate signal, a third multiplexer receiving input from the eleventh delay element and the fifth adder, and a twelfth delay element receiving input from the third multiplexer; wherein output from the twelfth delay element provides the third intermediate signal.

16. The CIC filter of claim 15, wherein the first, second, and third multipexers are operated based upon a count signal.

17. A method, comprising:
receiving a digital signal;
passing the digital signal through a Pth order comb cascade; and
applying outputs from each comb, except a Pth comb, of the Pth order comb cascade to precomputed integrator states of integrators of the Pth order comb cascade to thereby produce a filtered version of the digital signal.

18. The method of claim 17, further comprising precomputing the integrator states of the integrators of the Pth order comb cascade by performing both integration and upscaling functions.

19. The method of claim 18, wherein the upscaling function operates to interpolate at a interpolation factor of M.

20. The method of claim 19, wherein the Pth order comb cascade operates at a sampling frequency; wherein the pre-computing of the integrator states is performed at the sampling frequency; and wherein the application of the outputs from each comb, except the Pth comb, of the Pth order comb cascade to the pre-computed integrator states is performed at a frequency other than the sampling frequency.

* * * * *